United States Patent [19]

Schwartzmann et al.

[11] 3,868,588

[45] Feb. 25, 1975

[54] MICROWAVE OSCILLATOR OR AMPLIFIER USING PARAMETRIC ENHANCED TRAPATT CIRCUITS

[75] Inventors: Alfred Schwartzmann, Moorestown; Vitas Anthony Mikenas, Medford Lakes, both of N.J.; John Jerome Thomas, Levittown, Pa.; Kern Konan Chang, Princeton, N.J.

[73] Assignee: RCA Corporation, New York, N.Y.

[22] Filed: Jan. 11, 1974

[21] Appl. No.: 432,455

[52] U.S. Cl. ........................ 331/77, 330/4.9, 330/34, 330/61 A, 331/99, 331/107 R

[51] Int. Cl. ......... H03b 7/14, H03f 3/10, H03f 7/00

[58] Field of Search .............. 331/96, 99, 107 R, 77; 330/4.9, 5, 34, 61 A

[56] References Cited

UNITED STATES PATENTS

| | | | |
|---|---|---|---|
| 3,588,735 | 6/1969 | Chang et al. | 331/107 R X |
| 3,714,605 | 1/1973 | Grace et al. | 331/96 X |
| 3,743,966 | 7/1973 | Grace et al. | 331/107 R X |
| 3,793,539 | 2/1974 | Clorfeine | 331/107 R X |

*Primary Examiner*—Siegfried H. Grimm
*Attorney, Agent, or Firm*—Edward J. Norton; Joseph D. Lazar

[57] ABSTRACT

A semiconductor element is operated in the TRAPATT mode and is capable of generating a microwave signal at a plurality of harmonically related frequencies. The circuit, utilizing the electrical impedance characteristics of the mounted semiconductor element, converts these frequencies into a single desired output frequency which is then transmitted to a terminating load impedance.

12 Claims, 4 Drawing Figures

MICROWAVE OSCILLATOR OR AMPLIFIER USING PARAMETRIC ENHANCED TRAPATT CIRCUITS

The invention herein disclosed was made in the course of or under a contract or subcontract thereunder with the Department of the Navy.

BACKGROUND OF THE INVENTION

The present invention relates to a microwave apparatus which is capable of generating or amplifying a microwave signal utilizing the nonlinear reactance characteristic associated with semiconductor diodes in conjunction with frequency conversion circuitry which parametrically converts one or more harmonically related frequencies into a single output frequency.

A diode operating in the TRAPATT mode can be visualized as functioning like a nonlinear capacitor pumped by the current pulse produced by the trapped plasma. This current pulse has a high harmonic frequency content. This device may be operated as an oscillator by incorporating an output circuit which will pass the desired frequency, either the fundamental or one of the harmonics, to the terminating load impedance while rejecting all other frequencies. The principal drawback associated with this method of operation is that most of the energy contained in the unwanted frequencies is dissipated before reaching the load, thereby causing the output signal to be relatively weak in comparison with the potential output which is theoretically possible.

The conventional method of strengthening the output is to provide the diode with appropriate load impedances at the fundamental trapped plasma frequency and at least the second and third harmonic thereof. Traditionally, this was accomplished by using a separate tuned circuit for each frequency. Each tuned circuit comprises either an inductance element in series with a capacitance element or a transmission line with tuning stubs. Although the traditional method improves the output signal strength, the additional circuit elements required imposes a limit on the efficiency and bandwidth of the device.

SUMMARY OF THE INVENTION

A microwave apparatus includes a semiconductor element having a known internal capacitance and capable of generating a microwave signal at a plurality of frequencies which are harmonically related. A means for mounting the semiconductor element has an electrical impedance which is adjusted to enable the mounted semiconductor element to be self-resonant at one of the harmonically related frequencies. A frequency conversion means converts the energy contained in these harmonically related component frequencies into energy at a single desired output frequency. An output means transmits this output frequency to a terminating load impedance.

DETAILED DESCRIPTION

Figure 1:
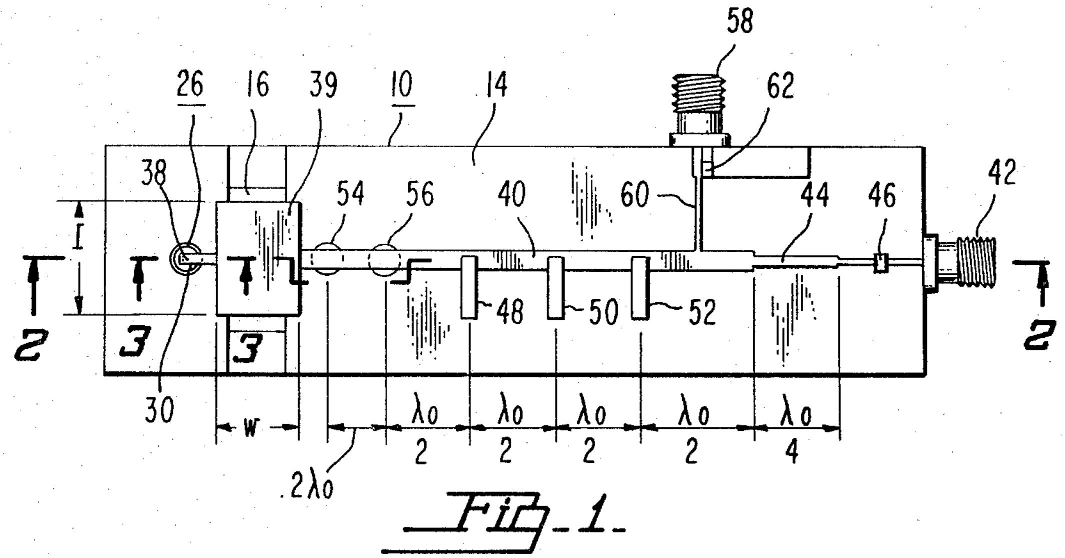
FIG. 1 is a top plan view of a form of the microwave apparatus of the present invention.
Figure 2:
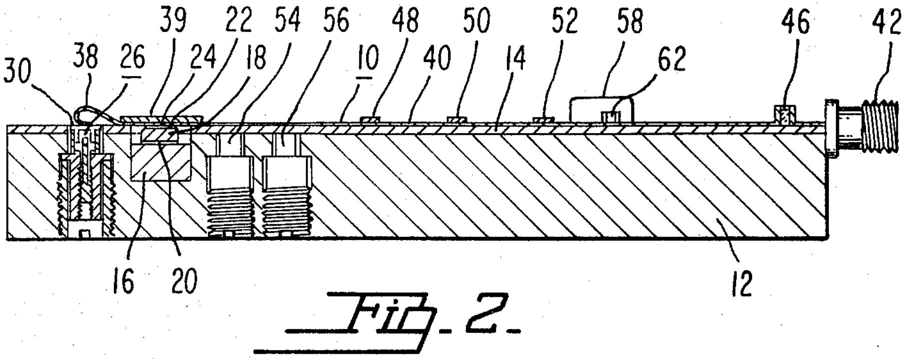
FIG. 2 is a sectional view taken along line 2—2 of FIG. 1.

Referring to FIGS. 1 and 2 of the drawing, there is shown a microwave apparatus generally designated as 10. The microwave apparatus 10 includes substrate 12 (see FIG. 2) of an electrically conductive metal, such as brass or aluminum. The substrate 12 serves as a ground plane and support structure for the microwave apparatus. A flat plate 14 of an electrical insulating material, such as alumina, is mounted on and bonded to the upper surface of the substrate 12.

A mounted semiconductor element comprises a diode mounting base 16, a semiconductor diode 18 and a cathode lead 24 (see FIG. 2). The diode mounting base 16, having good electrical and heat conducting properties such as copper, is mounted in a recess in the substrate 12. The diode mounting base 16 is electrically and mechanically connected, such as by machine screws (not shown), to the substrate 12. The diode 18 (see FIG. 2) having an anode electrode 20 and a cathode electrode 22, is mounted on the diode mounting base 16. The diode 18 is constructed in a manner suitable for TRAPATT operation such as described in U.S. Pat. No. 3,600,849. The anode electrode 20 is electrically and mechanically connected, such as by soldering or brazing, to the diode mounting base 16. Since the diode mounting base 16 is electrically connected to the substrate 12 and the substrate 12 serves as a ground plane, the anode electrode 20 of the diode 18 is electrically connected to ground. The cathode lead 24 (see FIG. 2) is mounted on and electrically connected, such as by soldering or brazing, to the cathode electrode 22. The cathode lead comprises a ribbon of an electrically conductive metal such as gold. Although the microwave apparatus described herein shows the diode anode electrode electrically connected to ground, it is understood that this configuration is for the purpose of example only. A configuration wherein the electrical connections to the diode electrodes are reversed, that is, the diode is inverted and the diode cathode electrode becomes grounded, is also within the scope and contemplation of the present invention.

Figure 3:
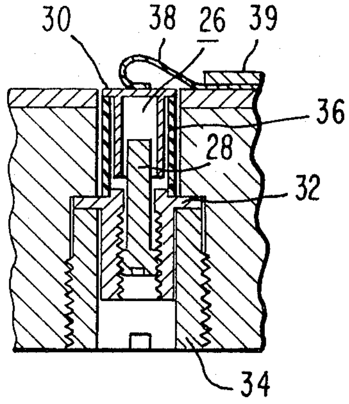
FIG. 3 is an enlarged view of the section 3—3 of FIG. 1.

A first variable capacitor 26 is mounted in the substrate 12 adjacent to the diode 18. Referring to FIG. 3, the first variable capacitor 26 includes two concentric cylinders which function as the capacitor plates. A moveable plate 28 comprises a solid threaded cylinder having good electrical conducting properties, such as brass or copper. A stationary plate 30 comprises a hollow cylinder having good electrical conducting properties, such as brass or copper. The internal diameter of the stationary plate 30 is sufficiently large to accommodate the moveable plate 28 without allowing physical contact between the two plates. The capacitance of the variable capacitor 26 varies in accordance with the depth of penetration of the moveable plate 28 into the stationary plate 30. The moveable plate 28 is mechanically supported by a threaded bushing 32. The threaded bushing 32 is in turn fastened to the substrate 12 by a threaded sleeve 34. The moveable plate 28 is electrically connected to the substrate 12 through the threaded bushing 32 and the threaded sleeve 34. Since the substrate 12 serves as a ground plane, the moveable plate 28 of the variable capacitor 26 is electrically connected to ground. The stationary plate 30 is mechanically supported by, but electrically insulated from, the threaded bushing 32 by an insulating sleeve 36.

Again referring to FIGS. 1 and 2, a first inductance element 38, such as a metal ribbon, is electrically connected between the stationary plate 30 of the first variable capacitor 26 and the cathode lead 24 of the diode 18. Consequently, the first inductance element 38 is connected in series with the first variable capacitor 26, forming a series resonance filter network which is in turn electrically connected in parallel with the mounted semiconductor element.

An electrical frequency resonator 39, forming a part of the output means, is mounted on the insulating plate 14. The resonator 39 is electrically connected to the cathode lead 24 such as by welding, soldering or brazing. The resonator 39 comprises a rectangular metal sheet whose length $l$ and width $w$ (see FIG. 1) are functionally related to the output frequency.

A transmission line filter segment, forming a part of the output means, comprises a metal film transmission line 40. The transmission line 40 is mounted on and bonded to the insulating plate 14. The transmission line 40 is electrically connected between the diode cathode lead 24 and an input/output electrical connector 42 through an impedance matching transformer 44 (see FIG. 1) and a DC blocking capacitor 46. The impedance matching transformer 44 comprises a metal film strip which is mounted on and bonded to the insulating plate 14. The width of the metal film strip is a function of the desired impedance. The linear change in width is functionally related to the wavelength $\lambda_o$ of the output frequency $f_o$ as shown in FIG. 1. Also included in the transmission line filter segment are metal film tuning stubs 48, 50 and 52. The metal film tuning stubs are mounted on and bonded to the insulating plate 14. One end of each of the stubs is electrically connected, such as by welding, soldering or brazing, to the transmission line 40. Each tuning stub is oriented substantially perpendicular to the transmission line 40. The distance between the tuning stubs 48 and 50 is substantially equal to $\lambda_o/2$. The distance between tuning stubs 50 and 52 is also substantially equal to $\lambda_o/2$ where $\lambda_o$ is the wavelength of the desired output frequency.

A fine tuning segment, also forming a part of the output means, comprises a second variable capacitor 54 and a third variable capacitor 56. The second and third variable capacitors are mounted in the substrate 12 beneath the transmission line 40. The distance between the tuning stub 48 and the third variable capacitor 56 is substantially equal to $\lambda_o/2$. The distance between the third variable capacitor 56 and the second variable capacitor 54 is substantially equal to $0.2\lambda_o$ where $\lambda_o$ is the wavelength of the desired output frequency. The construction and mounting of the second 54 and third 56 variable capacitors is substantially the same as the first variable capacitor 26. Referring to FIG. 3, the moveable plate 28 of the second variable capacitor 54 is electrically connected to ground through the threaded bushing 32 and the threaded sleeve 34. Similarly, the moveable plate 28 of the third variable capacitor 56 is electrically connected to ground through the threaded bushing 32 and the threaded sleeve 34. The stationary plate 30 of the second variable capacitor 54 and the stationary plate 30 of the third variable capacitor 56 are each electrically connected to the transmission line 40.

Referring back to FIGS. 1 and 2, a reverse bias application means comprises an electrical bias input connector 58, an inductance element 60 and a filter capacitor 62. The inductance element 60 comprises a metal film which is mounted on and bonded to the insulating plate 14. The inductance element is electrically connected between the transmission line 40 and the bias input connector 58. The filter capacitor 62 is mounted on the insulating plate 14. The filter capacitor 62 is electrically connected between the bias input side of the inductance element 60 and the substrate 12. Since the substrate 12 serves as a ground plane, the filter capacitor 62 is electrically connected between the bias input and ground.

Figure 4:
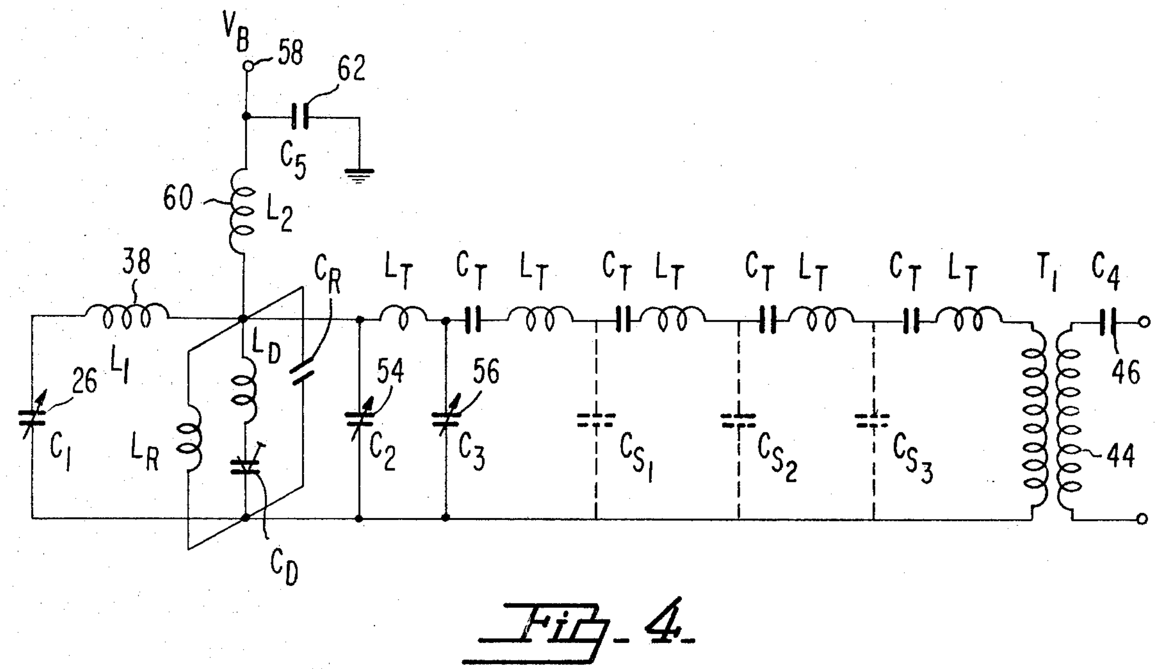
FIG. 4 is a schematic circuit diagram of the microwave apparatus of the present invention as represented by FIGS. 1 and 2.

Referring to FIG. 4, there is shown the schematic circuit diagram of the microwave apparatus 10. The impedance of the mounted semiconductor element comprises the inductance $L_D$ and the capacitance $C_D$. $L_D$ represents the inductance associated with the diode cathode lead 24. $C_D$ represents the capacitance associated with the diode 18. The inductance $L_D$ and the capacitance $C_D$ combine to form a series resonance circuit. A change in the physical size of the cathode lead 24 causes a corresponding change in the associated inductance $L_D$. Consequently, the impedance of the mounted semiconductor element can be designed to be resonant at a desired frequency, $f_s$, by appropriate sizing of the physical dimensions of the cathode lead 24.

$L_1$ represents the inductance of the metal ribbon 38. $C_1$ represents the capacitance of the first variable capacitor 26. The inductance $L_1$ and the capacitance $C_1$ combine to form a second series resonance circuit which is electrically connected in parallel with the series resonant mounted semiconductor element. A change in the physical size of the metal ribbon 38 causes a corresponding change in the associated inductance $L_1$. Consequently, the second series resonance circuit can be designed to be resonant at a desired frequency, $f_T$, by appropriate sizing of the metal ribbon 38 and adjustment of the capacitance of the first variable capacitor 26.

$L_T$ and $C_T$ represent the distributed inductance and capacitance, respectively, associated with the transmission line 40. $C_{S1}$, $C_{S2}$ and $C_{S3}$ are capacitances associated with the tuning stubs 48, 50 and 52 respectively. $C_2$ and $C_3$ represent the capacitances associated with the second and third variable capacitors 54 and 56 respectively. The elements $L_T$, $C_T$, $C_{S1}$, $C_{S2}$, $C_{S3}$, $C_2$ and $C_3$ together form a bandpass filter network which is part of the output means. This network is designed to pass a desired band of frequencies with center frequency $f_o$ by controlling the spatial relationships among the tuning stubs 48, 50, 52, the third variable capacitor 56 and the second variable capacitor 54. As shown in FIG. 1, these spacial relationships are functions of the wavelength $\lambda_o$ of the desired output frequency $f_o$. Further refinements in the band pass may be obtained by adjusting the capacitances $C_2$ and $C_3$ of the second and third variable capacitors respectively.

Referring back to FIG. 4, $L_R$ and $C_R$ represent the inductance and capacitance respectively associated with the electrical frequency resonator 39. The resonator functions as an output frequency selector causing a predetermined output frequency $f_o$ to be presented to the bandpass filter network for transmission to the input/output connector 42. The resonator 39 can be designed to resonate at the output frequency $f_o$ by making the length dimension $l$ substantially equal to $\lambda_o/2$ and the width dimension $w$ substantially equal to $0.4\lambda_o$. $\lambda_o$ is the wavelength of the desired output frequency $f_o$.

$T_l$ represents the impedance matching transformer 44. The impedance matching transformer transforms the impedance of the transmission line 40 into an impedance which matches that of an external transmission line (not shown) thereby allowing maximum power transfer to an external load (not shown). $C_4$ represents the capacitance of the DC blocking capacitor 46. The capacitance $C_4$ is appropriately sized to permit passage of the output frequency $f_o$ while preventing the appearance of any DC voltages at the input/output connector 42.

$V_B$ represents a DC bias voltage which is applied at the bias input connector 58. The input connector 58 is electrically connected to the diode cathode electrode 22 through the inductance element 60, the transmission line 40 and the cathode lead 24. Consequently, the DC bias voltage which is applied at the input connector 58 appears at the diode cathode electrode 22. When this bias voltage exceeds a predetermined threshold value, the diode 18 is triggered into the TRAPATT mode of operation. $C_5$ represents the capacitance of the filter capacitor 62. $L_2$ represents the inductance of the inductance element 60. Together, the filter capacitor 62 and the inductance element 60 form a biasing circuit which prevents leakage of the microwave energy into the DC bias power supply (not shown).

The preferred embodiment of the present invention may be operated as a microwave oscillator. When frequencies contained in a composite signal are harmonically related, the energy contained in one or more unwanted harmonics can be converted into a desired harmonic by presenting the signal generator with the appropriate load impedances. Ideally, the appropriate load impedances are either zero, infinite or purely reactive at the unwanted harmonic frequencies and purely resistive at the desired harmonic. In the preferred embodiment of the present invention, when operated as an oscillator, a DC reverse bias signal from the external source, not shown, is applied to the cathode electrode 22 of the diode 18. The bias signal is applied to the cathode electrode 22 through the bias input connector and the biasing circuit. The magnitude of the applied DC bias signal is sufficient to trigger the diode 18 into generating microwave energy in the TRAPATT mode of operation. The diode 18, operating in the TRAPATT mode, generates a microwave signal rich in harmonics. The operative frequencies $f_s$, $f_T$ and $f_o$ are harmonically related components of this microwave signal. The parameters $C_D$ and $L_D$ of the mounted semiconductor element are designed to provide a series resonance condition at $f_s$. This condition is essentially equivalent to zero impedance at $f_s$. The parameters $C_1$ and $L_1$ of the second series resonance circuit are designed to provide a series resonance condition at $f_T$. This condition is essentially equivalent to zero impedance at $f_T$. The parameters $C_2$, $C_3$, $C_{S1}$, $C_{S2}$ and $C_{S3}$ of the output means are designed to form a band pass filter which permits only the desired harmonic frequency $f_o$ to be transmitted to the dissipative terminating load impedance. As a result, this embodiment of the present invention causes the energy content of the output frequency $f_o$ to be enhanced by the energy content of the harmonically related frequencies $f_s$ and $f_l$.

It is theoretically possible, within the scope of the present invention, to convert the energy contained in all the harmonics present in a composite microwave signal into a desired output harmonic. This could be accomplished by providing each harmonic with an appropriate load impedance as indicated previously. However, since the higher order harmonics contain comparatively little energy, this embodiment of the present invention was limited to energy enhancement among the first, second, third and fourth harmonics only.

The following is a table showing some of the possible harmonic relationships between $f_s$, $f_T$ and $f_o$ for which energy enhancement is possible using the preferred embodiment of the present invention.

| Desired Output Frequency $f_o$ (Harmonics) | Series Resonance Frequency of Diode(s) $f_s$ (Harmonics) | Resonance Frequency of $L_l$ and $C_l$ $f_T$ (Harmonics) |
|---|---|---|
| Fundamental | Second | Third |
| do. | Third | Second |
| Second | Fundamental | Third |
| do. | Third | Fundamental |
| do. | Fourth | do. |
| Third | Fundamental | Second |
| do. | Second | Fundamental |
| do. | Fourth | do. |
| Fourth | Third | do. |

In addition, energy enhancement can be obtained between the sum and difference frequencies which are harmonically related to each other. Some of the possible sum and difference relationships for which energy enhancement is possible is shown in the following table where $f_H$ is any desired frequency contained in the TRAPATT signal.

| Output Frequency, $f_o$ | Series Resonance Frequency of Diode(s), $f_s$ | Resonance Frequency of $L_l$ and $C_l$ $f_T = f_s \pm f_o$ |
|---|---|---|
| $\frac{1}{2} f_H$ | $f_H$ | $3/2\ f_H (f_s + f_o)$ |
| $f_H$ | $3/2\ f_H$ | $\frac{1}{2} f_H (f_s - f_o)$ |
| $\frac{1}{3} f_H$ | $\frac{2}{3} f_H$ | $f_H (f_s + f_o)$ |
| $\frac{2}{3} f_H$ | $f_H$ | $\frac{1}{3} f_H (f_s - f_o)$ |

The preferred embodiment of the present invention may also be operated as a microwave amplifier or "trigger locked" oscillator. When operated in this manner, a ferrite circulator, not shown, may be used to couple microwave energy from an external source, not shown, to the diode 18. The microwave signal is applied to the diode 18 by way of the input/output connector 42, the DC blocking capacitor 46, the impedance matching transformer 44 and the transmission line 40. A DC reverse bias voltage is applied to the cathode electrode 22 of the diode 18 through the bias input connector 58 and the biasing circuit. However, the magnitude of the applied DC voltage is not sufficient to trigger the diode into the TRAPATT mode of operation. The applied microwave signal combines with the applied DC reverse bias voltage and triggers the diode 18 into the TRAPATT mode of operation. The diode 18, operating in the TRAPATT mode, generates a microwave signal, rich in harmonics, with a fundamental frequency which is equal to the frequency of the applied microwave signal. The fundamental frequency which is generated by the diode is the output frequency $f_o$ in the amplifier operation. In a manner similar to that described in the oscillator operation, the energy content of the output frequency $f_o$ is enhanced by the energy content of the harmonically related frequencies $f_s$ and $f_T$. The enhanced output frequency $f_o$ is transmitted to the circulator through the transmission line 40, the impedance matching transformer 44, the DC blocking capacitor 46 and the imput-output connector 42. The circulator in turn transmits the output frequency $f_o$ to an appropriate terminating load impedance (not shown). The magnitude of the microwave energy transmitted to the terminating load impedance is greater than the magnitude of the input microwave energy from the external source.

The principal advantages of the invention disclosed herein are the improved bandwidth, power and efficiency characteristics resulting from the use of the inductance and capacitance of the mounted semiconductor element to form a functional branch of the oscillator or amplifier circuitry. The prior art taught the use of separate tuned circuits for the fundamental trapped plasma frequency and at least the second and third harmonics thereof. Designing the mounted semiconductor element to be self-resonant at one of these frequencies permits the elimination of the tuned circuit which had previously been required for that particular frequency.

The elimination of one tuned circuit permits the reduction of the number of circuit elements required. At least one less capacitance element and one less inductance element are needed. Due to the presence of circulating currents, every circuit element stores energy to some degree. Consequently, the elimination of circuit elements reduces the total amount of energy stored by the circuitry of the device. This reduction of the total amount of energy stored makes more energy available for dissipation in the load, thereby increasing the output power and efficiency of the device. In addition, since the Q of the device is a function of the ratio of the energy stored to the energy dissipated, a reduction in the energy stored results in a decrease in the value of Q. Consequently, because the bandwidth of the device is inversely proportional to Q, a decrease in Q results in a corresponding increase in bandwidth.

We claim:

1. A microwave apparatus comprising:

a microwave transmission line;

a semiconductor element, having a known internal capacitance, capable of generating a microwave signal at a plurality of frequencies which are harmonically related, said semiconductor element having first and second electrodes;

an adjustable coupling means for coupling said semiconductor element to said transmission line so that said semiconductor element is self resonant at one of said harmonically related frequencies;

a frequency conversion means coupled to said transmission line, said frequency conversion means utilizing the said self resonance of said semiconductor element for converting energy contained in said harmonically related component frequencies of said microwave signal into energy at a single desired output frequency; and an output means for transmitting said output frequency to a terminating load impedance, said output means having an electrical frequency resonator providing a parallel circuit coupled across said first and second electrodes, said parallel circuit being resonant at said desired output frequency.

2. A microwave apparatus in accordance with claim 1 in which said semiconductor element comprises one or more diodes operating in the TRAPATT mode.

3. A microwave apparatus in accordance with claim 2 including means for applying a reverse bias signal, exceeding a predetermined threshold magnitude, across said electrodes of said diodes, to effect said diodes being triggered into said TRAPATT mode of operation.

4. A microwave apparatus in accordance with claim 3, wherein said reverse bias signal is a D.C. voltage having a magnitude exceeding said predetermined threshold magnitude, whereby said diodes oscillate at a desired fundamental frequency plus harmonics.

5. A microwave apparatus in accordance with claim 3, wherein said reverse bias signal is the sum of a D.C. voltage having a magnitude less than said predetermined threshold magnitude and the amplitude of an applied microwave input signal, said sum having a magnitude exceeding said predetermined threshold magnitude, whereby said diode is triggered into amplifying said applied microwave input signal.

6. A microwave apparatus in accordance with claim 1 in which said coupling means includes an inductor element connected in series with said semiconductor element, said inductor element having an inductance adjusted to be resonant with said internal capacitance of said semiconductor element at a desired frequency.

7. A microwave apparatus in accordance with claim 6 in which said inductor element comprises a metal ribbon having an inductance adjusted by changing physical dimensions of said ribbon.

8. A microwave apparatus in accordance with claim 1 in which said frequency conversion means comprises two or more filter networks, each of said filter networks being series resonant at a predetermined frequency.

9. A microwave apparatus in accordance with claim 8 in which one or more of said filter networks are coupled to said transmission line in parallel with said semiconductor element.

10. A microwave apparatus in accordance with claim 1 in which said output means comprises a transmission line filter segment and a fine tuning segment.

11. A microwave apparatus in accordance with claim 1 in which said electrical frequency resonator comprises a planar metal film layer electrically connected to said first electrode of said semiconductor element.

12. A microwave apparatus in accordance with claim 10 in which said fine tuning segment comprises one or more variable capacitors, each being connected in parallel across said first and second electrodes of said semiconductor element.

* * * * *